(12) United States Patent
Takata et al.

(10) Patent No.: US 9,779,938 B2
(45) Date of Patent: Oct. 3, 2017

(54) METAL OXIDE THIN FILM, METHOD OF PRODUCING SAME, AND COATING SOLUTION FOR FORMING METAL OXIDE THIN FILM USED IN SAID METHOD

(71) Applicant: FUJIFILM Corporation, Tokyo (JP)

(72) Inventors: Masahiro Takata, Ashigarakami-gun (JP); Makoto Kikuchi, Ashigarakami-gun (JP); Atsushi Tanaka, Ashigarakami-gun (JP); Masayuki Suzuki, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/989,059

(22) Filed: Jan. 6, 2016

(65) Prior Publication Data
US 2016/0118253 A1 Apr. 28, 2016

Related U.S. Application Data

(63) Continuation of application No. PCT/JP2014/003558, filed on Jul. 4, 2014.

(30) Foreign Application Priority Data

Jul. 10, 2013 (JP) ................................. 2013-144296

(51) Int. Cl.
*H01L 21/02* (2006.01)
*H01L 29/66* (2006.01)
(Continued)

(52) U.S. Cl.
CPC .. *H01L 21/02565* (2013.01); *H01L 21/02554* (2013.01); *H01L 21/02628* (2013.01);
(Continued)

(58) Field of Classification Search
CPC ......... H01L 21/02565; H01L 21/02554; H01L 21/02631; H01L 21/02587
See application file for complete search history.

(56) References Cited

U.S. PATENT DOCUMENTS

| | | |
|---|---|---|
| 6,677,278 B1 | 1/2004 | Woodall et al. |
| 2009/0173938 A1 | 7/2009 | Honda et al. |

(Continued)

FOREIGN PATENT DOCUMENTS

| | | |
|---|---|---|
| JP | 2003-525189 A | 8/2003 |
| JP | 2008-297138 A | 12/2008 |

(Continued)

OTHER PUBLICATIONS

Machine Translation of JP 2012-216729.*

(Continued)

*Primary Examiner* — Julia Slutsker
(74) *Attorney, Agent, or Firm* — Birch, Stewart, Kolasch & Birch, LLP

(57) ABSTRACT

A metal oxide thin film according to the present invention has a peak which is attributed to 1s electrons of nitrogen in a binding energy range of 402 eV to 405 eV in an XPS spectrum obtained by X-ray photoelectron spectroscopy, in which peak areas, which are obtained by separation of peaks having a peak energy of a metal-oxygen bond attributed to 1s electrons of oxygen, satisfy the following expression.

$$0.9 < D/E \tag{1}$$

(D represents a peak area of a component having a peak position in a binding energy range of 529 eV or higher and lower than 531 eV, and E represents a peak area of a component having a peak position in a binding energy range of 531 eV to 532 eV.)

8 Claims, 8 Drawing Sheets

(51) Int. Cl.
*H01L 29/786* (2006.01)
*H01L 29/24* (2006.01)
*G02F 1/1368* (2006.01)

(52) U.S. Cl.
CPC ........ *H01L 29/24* (2013.01); *H01L 29/66969* (2013.01); *H01L 29/7869* (2013.01); *H01L 29/78603* (2013.01); *G02F 2001/13685* (2013.01)

(56) References Cited

U.S. PATENT DOCUMENTS

| 2010/0044694 | A1* | 2/2010 | Son .......................... H01B 1/08 257/40 |
| 2012/0313152 | A1 | 12/2012 | Yokoi et al. |
| 2014/0103341 | A1 | 4/2014 | Umeda et al. |

FOREIGN PATENT DOCUMENTS

| JP | 2010-258057 A1 | 11/2010 |
| JP | 2011-126746 A | 6/2011 |
| JP | 2012-216729 A | 11/2012 |
| JP | 2013-16785 A | 1/2013 |
| JP | 2013-18696 A | 1/2013 |
| WO | WO 2009/011224 A1 | 1/2009 |
| WO | WO 2009/031381 A1 | 3/2009 |
| WO | WO 2009/081862 A1 | 7/2009 |
| WO | WO 2012/103528 A2 | 8/2012 |

OTHER PUBLICATIONS

Japanese Notification of Reasons for Refusal for Japanese Application No. 2013-144296, dated Sep. 6, 2016, with machine translation thereof.
International Search Report for PCT/JP2014/003558 dated Oct. 21, 2014.
Kim et al., "Flexible metal-oxide devices made by room-temperature photochemical activation of sol-gel films", Nature, vol. 489, Sep. 6, 2012, pp. 128-132 (6 pages total).
Rodriguez et al., "Reaction of NO2 with Zn and ZnO: Photoemission, XANES, and Density Functional Studies on the Formation of NO3", J. Phys. Chem. B, vol. 104, No. 2, 2000, pp. 319-328.
Written Opinion of the International Searching Authority for PCT/JP2014/003558 dated Oct. 21, 2014.

\* cited by examiner

METAL OXIDE THIN FILM, METHOD OF PRODUCING SAME, AND COATING SOLUTION FOR FORMING METAL OXIDE THIN FILM USED IN SAID METHOD

CROSS-REFERENCE TO RELATED APPLICATIONS

This application is a Continuation of PCT International Application No. PCT/JP2014/003558 filed on Jul. 4, 2014, which claims priority under 35 U.S.C. §119 (a) to Japanese Patent Application No. 2013-144296 filed on Jul. 10, 2013. Each of the above applications is hereby expressly incorporated by reference, in its entirety, into the present application.

BACKGROUND OF THE INVENTION

1. Field of the Invention

The present invention relates to a method of producing a metal oxide thin film using a coating method, the metal oxide thin film being used as a semiconductor layer, an insulating layer, or a conductive layer in various electronic devices such as a thin film transistor. Further, the present invention relates to a coating solution used in the same method and a metal oxide thin film obtained using the same method.

2. Description of the Related Art

A thin film transistor is mounted in an electronic device such as a liquid crystal display, an organic EL display, or an X-ray sensor. As a substrate for forming a thin film transistor, in general, a glass substrate is used. However, an electronic device is required to be flexible and be reduced in weight, and the use of a flexible and light-weight substrate is desired.

Examples of the flexible and light-weight substrate include: a resin film such as a plastic substrate; and a flexible substrate such as a thin metal substrate. From the viewpoints of transparency, substrate price, and the like, an inexpensive plastic substrate is preferable. Since an inexpensive plastic substrate has a problem in heat resistance, it is necessary to form a thin film transistor through a low-temperature process.

In an electronic device such as a thin film transistor, a metal oxide thin film is used as a semiconductor film such as an active layer, an insulating film, or a conductive film such as an electrode.

In general, a metal oxide thin film is formed using vacuum deposition such as a sputtering method. As a method of simply forming a metal oxide thin film at a low temperature under the atmospheric pressure, a film formation method using a liquid-phase process is considered.

Nature, Vol. 489, p. 128, 2012, reports a method of manufacturing a thin film transistor (TFT) having high charge transport characteristics at a low temperature of 150° C. or lower, the method including: coating a substrate with a solution containing a precursor of a metal oxide semiconductor thin film; and performing ultraviolet irradiation.

In addition, a method of obtaining a metal oxide semiconductor film is reported, the method including: forming a metal oxide semiconductor precursor film using a solution containing an inexpensive nitrate, acetate, or the like; and performing a semiconductor conversion treatment on the precursor film (for example, WO2009/081862A, WO2009/031381A, WO2009/011224A, and JP2010-258057A).

WO2009/081862A discloses a method of producing a metal oxide semiconductor film, the method including: forming a precursor film containing a nitrate or an acetate of In, Zn, Sn, Ga, Al, or the like; and performing a semiconductor conversion treatment such as a heat treatment at 100° C. to 400° C. or microwave irradiation on the precursor film.

WO2009/031381A describes that electromagnetic irradiation is performed in the presence of oxygen as a semiconductor conversion treatment. WO2009/011224A describes that ultraviolet irradiation is performed in the presence of oxygen as a semiconductor conversion treatment after a solvent is volatilized by heating at about 150° C. JP2010-258057A describes that a coating film is dried by volatilizing a solvent at about 80° C. to 100° C., is heated at 50° C. to 200° C., and is converted into a metal oxide semiconductor using an oxygen plasma method, a thermal oxidation method, a UV ozone method, or microwave irradiation (refer to JP2010-258057A).

SUMMARY OF THE INVENTION

As described in the above-described documents, a metal oxide thin film can be formed at a low temperature under the atmospheric pressure using the method in which a metal oxide thin film is formed by performing a semiconductor conversion treatment on a precursor film containing a nitrate. However, since the metal oxide thin film which is formed using the method is formed at a low temperature, it is difficult to form a sufficient amount of a metal-oxygen-metal bond network in the film. The metal-oxygen-metal bond network contributes to electron transfer characteristics of a film and also contributes to densification of a thin film.

The present invention has been made in consideration of the above-described circumstances, and an object thereof is to provide a dense metal oxide thin film having desired conductivity and a controlled amount of a metal-oxygen-metal bond network, in which the metal oxide thin film can be produced on an inexpensive plastic substrate at a low temperature under the atmospheric pressure.

Another object of the present invention is to provide: a method of producing a metal oxide thin film using a coating solution containing a metal nitrate, in which a dense metal oxide thin film having desired conductivity and a controlled amount of a metal-oxygen-metal bond network can be produced on an inexpensive plastic substrate at a low temperature under the atmospheric pressure; and a coating solution used in the same method.

The metal oxide thin film according to the present invention has a peak which is attributed to 1 s electrons of nitrogen in a binding energy range of 402 eV to 405 eV in an XPS spectrum obtained by X-ray photoelectron spectroscopy, in which peak areas, which are obtained by separation of peaks having a peak energy attributed to 1 s electrons of oxygen, satisfy the following expression (1).

$$0.9 < D/E \qquad (1)$$

(D represents a peak area of a component having a peak position in a binding energy range of 529 eV or higher and lower than 531 eV, and E represents a peak area of a component having a peak position in a binding energy range of 531 eV to 532 eV.)

In this specification, "peak area" refers to a peak area which is separated with a peak of plural Gaussian functions when a peak position, a full width at half maximum, and an intensity, which are obtained by waveform separation of peaks attributed to each electron orbital, are used as fitting parameters.

The X-ray photoelectron spectroscopy is performed using a XPS spectrum which is obtained under the following conditions of X-ray source: monochromatic AlKα (100 μmφ, 25 W, 15 kV), analysis diameter: 100 μmφ, and photoelectron extraction angle: 45°.

In this specification, a numerical value range indicated by the symbol "~" includes a lower limit value and an upper limit value.

It is preferable that the metal oxide thin film according to the present invention does not substantially contain a component having a peak position in a binding energy range of 406 eV to 408 eV in the XPS spectrum.

When the metal oxide thin film according to the present invention is a semiconductor film, it is preferable that the following expression (2) is satisfied, and it is more preferable that the following expression (3) is satisfied.

$$0.9<D/E\leq 5.5 \tag{2}$$

$$1\leq D/E\leq 5.1 \tag{3}$$

When the metal oxide thin film according to the present invention is a semiconductor film or a conductive film, it is preferable that at least indium is contained as one of the metal components. Preferable examples of a metal component other than indium include, zinc, tin, gallium and aluminum. Among these metal components, plural kinds may be contained. It is preferable that the content of indium is 50 atom % or higher with respect to all the metal elements contained in the metal oxide thin film.

The metal oxide precursor thin film according to the present invention can be produced using a method of producing a metal oxide thin film according to the present invention, the method including; a precursor thin film forming step of forming a metal oxide precursor thin film by preparing a substrate, coating the substrate with the coating solution for forming a metal oxide thin film according to the present invention described below, and drying the substrate; and a conversion step of converting the metal oxide precursor thin film into a metal oxide thin film.

It is preferable that the conversion step includes a step of irradiating the metal oxide precursor thin film with ultraviolet rays, and it is more preferable that, in the conversion step, the metal oxide precursor thin film is irradiated with ultraviolet rays having a wavelength of 300 nm or shorter at an intensity of 10 mW/cm² or higher. The maximum temperature of the substrate in the conversion step is preferably 200° C. or lower and more preferably 120° C. to 200° C.

It is preferable that, in the precursor thin film forming step, the drying is performed such that the maximum temperature of the substrate is 35° C. to 100° C.

The coating solution for forming a metal oxide thin film according to the present invention satisfies the following expression (4). For example, in the coating solution for forming a metal oxide thin film, a nitrate of the at least one metal is dissolved in a solvent.

$$1<B/(A\times C) \tag{4}$$

(In the expression (4), A represents the mol concentration (mol/L) of metal contained in the coating solution, B represents the total mol concentration (mol/L) of nitrate ions and nitrite ions in the coating solution, and C represents an average valence when the metal component is a metal oxide thin film.)

In this specification, "the mol concentration of metal contained in the coating solution" refers to the total mol concentration of all the metal components contained in the coating solution.

In addition, "the average valence when the metal component is a metal oxide thin film" refers to a value which is obtained by multiplying the valence of each metal component constituting the metal oxide thin film by the number of atoms of the metal component in the composition, adding the multiplied values of the metal components, and dividing the added value by the total number of all the metal atoms in the composition. For example, when the metal oxide thin film is indium oxide ($In_2O_3$), the valence of In is 3, and the number of atoms in the composition is 2. Therefore, the average valence when the metal component is a metal oxide thin film is (3×2)/2=3. In addition, when the metal oxide thin film is $InGaZnO_4$, the valences of In, Ga, and Zn are 3, 3, and, 2, respectively, and the numbers of atoms of the metal components in the composition are all 1. Therefore, the average valence when the metal component is a metal oxide thin film is (3×1+3×1+2×1)/(1+1+1)=8/3.

In the coating solution for forming a metal oxide thin film according to the present invention, it is preferable that a nitrate of the at least one metal is dissolved in a solvent, it is more preferable that the following expression (5) is satisfied, and it is still more preferable that the following expression (6) is satisfied.

$$1<B/(A\times C)\leq 1.9 \tag{5}$$

$$1.1\leq B/(A\times C)\leq 1.6 \tag{6}$$

It is preferable that the mol concentration A of the metal is 0.01 mol/L to 0.5 mol/L.

In the coating solution for forming a metal oxide thin film according to the present invention, it is preferable that one or more of concentrated nitric acid, fuming nitric acid, or a nitrate are added. In addition, it is preferable that the solvent contains methanol or methoxyethanol.

In the case of a semiconductor thin film, it is preferable that at least indium is contained as one of the metal components. Preferable examples of a metal component other than indium include, zinc, tin, gallium and aluminum. Among these metal components, plural kinds may be contained.

A thin film transistor according to the present invention includes the metal oxide thin film according to the present invention, which is a semiconductor, as an active layer and can be preferably used in a display apparatus.

According to the invention, the method of producing a metal oxide thin film is provided, in which the metal oxide thin film can be produced on an inexpensive plastic substrate at a low temperature under the atmospheric pressure. In this method, the metal oxide thin film can be formed by coating the substrate with the coating solution which satisfies the expression (4) and then performing the drying and conversion steps. In the coating solution, before the conversion step, the precursor film contains an excess amount of nitrate ions or nitrite ions compared to a precursor film which is formed using a coating solution in which a metal nitrate is simply dissolved. The presence of the excess amount of nitrate ions or nitrite ions exhibits an effect of increasing the amount of a metal-oxygen-metal bond network in an oxide thin film during the oxide film formation. Therefore, according to the present invention, a dense metal oxide thin film having desired conductivity and a controlled amount of a metal-oxygen-metal bond network can be easily produced on an inexpensive plastic substrate at a low temperature under the atmospheric pressure.

The metal oxide thin film according to the present invention is a dense film having desired conductivity and a controlled amount of a metal-oxygen-metal bond network which can be produced at a low temperature under the atmospheric pressure.

DESCRIPTION OF THE PREFERRED EMBODIMENTS

Figure 1:
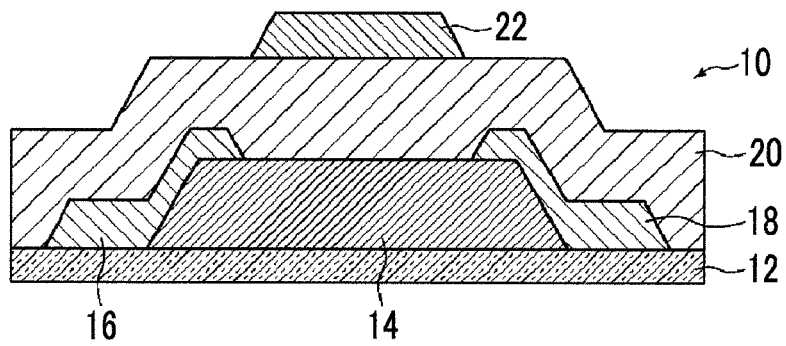
FIG. 1 is a schematic diagram showing a configuration example of a thin film transistor (top gate-top contact type) which is manufactured according to the present invention.

[Metal Oxide Thin Film, Method of Producing Metal Oxide Thin Film, and Coating Solution for Forming Metal Oxide Thin Film]

Hereinafter, a metal oxide thin film, a method of producing a metal oxide thin film, and a coating solution for forming a metal oxide thin film used in the same method according to an embodiment of the present invention will be described.

As described in "SUMMARY OF THE INVENTION", when a low-temperature process at 200° C. or lower is performed in the method of producing a metal oxide thin film using a coating solution containing a metal nitrate (hereinafter, referred to as "nitrate method"), it is difficult to form a sufficient amount of a metal-oxygen-metal bond network in the film. The metal-oxygen-metal bond network contributes to electron transfer characteristics of a metal oxide semiconductor film or a conductive film and also contributes to densification of a thin film.

The present inventors found that the amount of a metal-oxygen-metal bond network in a metal oxide thin film obtained through a step of conversion into a metal oxide thin film can be controlled by controlling the mol concentration of metal components and the mol concentration of nitrate ions and nitrite ions in a solution in the nitrate method. In addition, the present inventors thought that, based on the above finding, a metal oxide semiconductor film or a metal oxide conductive film having high electron transfer characteristics, or a metal oxide insulating film having high insulating characteristics can be produced.

In the above-described documents such as WO2009/081862A, in the nitrate method, for example, an oxygen plasma method or a UV ozone method is used as a method of performing a semiconductor conversion treatment (oxidation treatment) in a nitrogen atmosphere. Due to the oxidation treatment performed in an oxygen atmosphere, an oxidation promoting effect caused by the oxygen atmosphere is obtained from a film surface. Therefore, it is difficult to oxidize the entire film at a low temperature within a short period of time. As a result, oxygen defects may be distributed in a thickness direction of a metal oxide thin film, and it is difficult to obtain a uniform metal oxide thin film with high reproducibility.

The present inventors found that: the amount of a metal-oxygen-metal bond network in a metal oxide thin film can be adjusted by using a method of adjusting the amount of an oxygen source in a coating solution as a method of promoting the oxidation of a metal oxide thin film at a low temperature to easily form a metal-oxygen-metal bond network in the film; as a result, a metal oxide semiconductor film or a metal oxide conductive film having high electron transfer characteristics, or a metal oxide insulating film having high insulating characteristics can be produced.

This metal oxide thin film contains an excess amount of nitrate ions or nitrite ions compared to a precursor film which is formed using a coating solution in which a metal nitrate is simply dissolved. The presence of the excess amount of nitrate ions or nitrite ions exhibits an effect of increasing the amount of a metal-oxygen-metal bond network in an oxide thin film during the oxide film formation.

That is, according to the present invention, a metal oxide precursor thin film is produced using a method including: a precursor thin film forming step of forming a metal oxide precursor thin film by preparing a substrate, coating the substrate with a coating solution for forming a metal oxide thin film which satisfies the following expression (4), and drying the substrate; and a conversion step of converting the metal oxide precursor thin film into a metal oxide thin film.

$$1 < B/(A \times C) \qquad (4)$$

(In the expression (4), A represents the mol concentration (mol/L) of metal contained in the coating solution, B represents the total mol concentration (mol/L) of nitrate ions and nitrite ions in the coating solution, and C represents an average valence when the metal component is a metal oxide thin film.)

<Precursor Thin Film Forming Step>

In the precursor thin film forming step, a metal oxide precursor thin film is formed by preparing a substrate, coating the substrate with a coating solution for forming a metal oxide thin film according to the present invention, and drying the substrate.

(Substrate)

The shape, structure, size, and the like, of the substrate are not particularly limited and can be appropriately selected according to the purpose. The structure of the substrate may be a single-layer structure or a laminate structure.

A material constituting the substrate is not particularly limited. For example, an inorganic substrate such as glass or yttria-stabilized zirconia (YSZ), a resin substrate, or a composite material thereof can be used. Among these, a resin substrate or a composite material thereof is preferable from the viewpoint of being light-weight and flexible. Specific examples of the substrate include: a fluororesin such as polybutylene terephthalate, polyethylene terephthalate, polyethylene naphthalate, polybutylene naphthalate, polystyrene, polycarbonate, polysulfone, polyethersulfone, polyarylate, allyl diglycol carbonate, polyamide, polyimide, polyamide imide, polyether imide, polybenzazole, polyphenylene sulfide, polycycloolefin, a norbornene resin, or polychlorotrifluoroethylene; a synthetic resin substrate such as a liquid crystal polymer, an acrylic resin, an epoxy resin, a silicone resin, an ionomer resin, a cyanate resin, a cross-linked fumaric acid diester, a cyclic polyolefin, an aromatic ether, maleimide-olefin, cellulose, or an episulfide compound; a composite plastic material containing silicon oxide particles; a composite plastic material containing metal nanoparticles, inorganic oxide nanoparticles, or inorganic nitride nanoparticles; a composite plastic material containing carbon fiber or carbon nanotube; a composite plastic material containing glass flake, glass fiber, or glass beads; a composite plastic material containing clay mineral or particles having a mica-derived crystal structure; a laminated plastic material including at least one bonded interface formed between thin glass and any one of the above-described organic materials; a composite material with barrier performance including at least one bonded interface which is obtained by alternately laminating an inorganic layer and an organic layer; a stainless steel substrate or a multilayer metal substrate obtained by laminating stainless steel and another different metal; and an aluminum substrate or an aluminum substrate with an oxide film in which an oxidation treatment (for example, anodic oxidation) is performed on a surface thereof to improve insulating characteristics of the surface. Moreover, it is preferable that the resin substrate is superior in heat resistance, dimension stability, solvent resistance, electric insulating characteristics, workability, low gas permeability, low moisture absorbency, or the like. The resin substrate may include, for example, a gas barrier layer for preventing permeation of water or oxygen or an undercoat layer for improving flatness of the resin substrate or adhesion with a lower electrode.

The thickness of the substrate used in the present invention is not particularly limited and is preferably 50 μm to 500 μm. When the thickness of the substrate is 50 μm or more, the flatness of the substrate is further improved. In addition, when the thickness of the substrate is 500 μm or less, the flexibility of the substrate is further improved and can be more easily used as a substrate for a flexible substrate.

(Coating Solution for Forming Metal Oxide Thin Film (Coating Solution))

As described above, the coating solution for forming a metal oxide thin film (hereinafter, referred to as "coating solution") according to the embodiment satisfies the following expression (4).

$$1 < B/(A \times C) \qquad (4)$$

(In the expression (4), A represents the mol concentration (mol/L) of metal contained in the coating solution, B represents the total mol concentration (mol/L) of nitrate ions and nitrite ions in the coating solution, and C represents an average valence when the metal component is a metal oxide thin film.)

A method of preparing the coating solution is not particularly limited. A method is preferable which includes: weighing a solute containing a metal nitrate and a nitrate ion source or a nitrite ion source other than a metal nitrate so as to obtain a desired solution concentration; and stirring and dissolving the weighed components in a solvent. In the method, the temperature and time during stirring are not particularly limited as long as the solute is sufficiently dissolved in the solvent. The nitrate may be a hydrate.

The solvent of the coating solution according to the embodiment is not particularly limited, and examples thereof include water, an alcohol solvent (for example, methanol, ethanol, propanol, or ethylene glycol), an amide solvent (for example, N,N-dimethylformamide or N,N-dimethylacetamide), a ketone solvent (for example, acetone, N-methylpyrrolidone, sulfolane, N-N-dimethylimidazolidinone, or acetylacetone), an ether solvent (for example, tetrahydrofuran or methoxyethanol), a nitrile solvent (for example, acetonitrile), and a solvent containing a heteroatom other than the above-described solvents. From the viewpoints of solubility of a metal salt and wettability, methanol or methoxyethanol is particularly preferably used.

The coating solution according to the embodiment may contain another metal atom-containing compound according to a desired oxide semiconductor or oxide conductor. Examples of the metal atom-containing compound include a metal salt other than a nitrate, a metal halide, and an organic metal compound. Examples of the metal salt other than a nitrate include a sulfate, a phosphate, a carbonate, an acetate, and an oxalate. Examples of the metal halide include a chloride, an iodide, and a bromide. Examples of the organic metal compound include a metal alkoxide, an organic acid salt, and a metal β diketonate.

The nitrate ion source or the nitrite ion source other than a metal nitrate is not particularly limited, and examples thereof include concentrated nitric acid, fuming nitric acid, a nitrate, and a nitrite. The coating solution may be prepared by adding concentrated nitric acid or the like to a solution in which the metal salt other than a nitrate is dissolved in the solvent.

By adding these ion sources, the total mol concentration of nitrate ions and nitrite ions can be increased without increasing the mol concentration of the metal components in the solution. In addition, these ion sources are preferable because they are not likely to be present as impurities in the obtained metal oxide thin film.

In addition, the coating solution according to the embodiment may be prepared using a method of dissolving metal in an acid such as nitric acid without using the method in which the metal atom-containing compound is used.

In the solution in which a metal nitrate is dissolved in a solvent, nitrate ions are monovalent negative ions, and thus $B/(A \times C)$ on the right side of the expression (4) is 1. Nitrate ions in the solution may be partially replaced with nitrite ions. Therefore, typically, when the metal nitrate is used, the expression (4) implies that a nitrate ion source or a nitrite ion source other than a metal nitrate is added to the coating solution. Even the solution in which a metal nitrate is dissolved in a solvent can satisfy the expression (4), for example, using a method of adding a material, on which a specific kind of metal among the contained metal ions is specifically adsorbed, to the coating solution.

In addition, the coating solution, which is prepared by dissolving metal in an acid such as nitric acid, can satisfy the expression (4) by adjusting the addition amounts of the metal and the nitric acid.

When the metal oxide thin film is a semiconductor film or a conductive film in the coating solution according to the embodiment, it is preferable that the following expression (5) is satisfied, and it is more preferable that the following expression (6) is satisfied.

$$1 < B/(A \times C) \leq 1.9 \quad (5)$$

$$1.1 \leq B/(A \times C) \leq 1.6 \quad (6)$$

The concentration of the nitrate in the coating solution can be selected according to the viscosity of the solution or the desired thickness thereof. From the viewpoints of the flatness and productivity of the film, the concentration of the nitrate is preferably 0.01 mol/L to 0.5 mol/L and more preferably 0.05 mol/L to 0.2 mol/L. In addition, the mol concentration A of the metal is not particularly limited and is preferably 0.01 mol/L to 0.5 mol/L.

In the case of a semiconductor thin film or a conductive film, it is preferable that at least indium is contained as one of the metal components. When indium is added, a film having superior electron transfer characteristics is likely to be obtained. Moreover, when indium nitrate is used as an indium source, the mol concentration of nitrate ions and nitrite ions in the solution is likely to be increased. In addition, when ultraviolet rays are used in the subsequent conversion step, indium nitrate can efficiently absorb ultraviolet rays, and an indium-containing oxide can be easily formed.

When the coating solution contains not only indium but also at least one metal element selected from the group consisting of zinc, tin, gallium, and aluminum, electron transfer characteristics of the obtained oxide semiconductor film or oxide conductive film are further improved, and electrical stability of the film is improved.

Examples of the oxide semiconductor film or oxide conductive film containing indium and another metal element include In—Ga—Zn—O, In—Zn—O, In—Ga—O, In—Sn—O, and In—Sn—Zn—O. In—Ga—Zn—O refers to an oxide containing In, Ga, and Zn, and the composition thereof may contain an oxide having a stoichiometric composition in terms of chemical formula or having a composition deviated from the stoichiometric composition.

In the coating solution according to the embodiment, before the step of conversion to an oxide, the precursor film contains an excess amount of nitrate ions or nitrite ions compared to a precursor film which is formed using a coating solution in which a metal nitrate is simply dissolved. The presence of the excess amount of nitrate ions or nitrite ions exhibits an effect of increasing the amount of a metal-oxygen-metal bond network in an oxide thin film during the oxide film formation.

The present inventors thought that, in the conversion step of the precursor film, nitrate ions or nitrite ions are decomposed and active oxygen is supplied to the film. In addition, the present inventors thought that, due to the presence of an excess amount of nitrate ions or nitrite ions in the precursor film, a large amount of active oxygen is supplied to the film, and an effect of increasing the amount of a metal-oxygen-metal bond network in the oxide film obtained after the conversion is exhibited. However, the above-described configurations are not clear.

According to the present invention, a metal oxide semiconductor film or a metal oxide conductive film having high electron transfer characteristics and a controlled amount of a metal-oxygen-metal bond network, or a metal oxide insulating film having high insulating characteristics can be easily produced at a low temperature under the atmospheric pressure.

(Coating)

A method of coating the substrate with the coating solution according to the embodiment is not particularly limited, and examples thereof include a spray coating method, a spin coating method, a blade coating method, a dip coating method, a cast method, a roll coating method, a bar coating method, a die coating method, a mist method, an ink jet method, a dispenser method, a screen printing method, a relief printing method, and an intaglio printing method. In particular, from the viewpoint of easily forming a fine pattern, it is preferable that at least one coating method selected from the group consisting of an ink jet method, a dispenser method, a relief printing method, and an intaglio printing method is used.

(Drying)

After coating the substrate with the coating solution to obtain a coating film, the coating film is dried to reduce the fluidity of the coating film, thereby obtaining a metal oxide precursor thin film. In the drying step, the flatness of the finally obtained oxide semiconductor film can be obtained. In order to maintain a substantially uniform film thickness, it is preferable that the drying step starts within 5 minutes after the formation of the metal oxide precursor thin film.

A drying method is not particularly limited, but a method of heating the substrate is preferable because this method is simple. The heating method is not particularly limited and, for example, can be selected from hot plate heating, electric furnace heating, infrared heating, and microwave heating.

The maximum temperature of the substrate in the drying step is preferably 35° C. to 100° C. and more preferably 35° C. to 90° C. It is preferable that the substrate temperature is selected according to the kind of the solvent to be used and the kind and use of the metal oxide thin film. When the maximum temperature of the substrate is 35° C. or higher, the flatness of the film is maintained to be uniform. When the maximum temperature of the substrate is 100° C. or lower and preferably 90° C. or lower, nitrate ions and nitrite ions can be efficiently decomposed in the conversion step. As a result, a metal-oxygen-metal bond network is likely to be formed, and a dense metal oxide thin film is likely to be obtained.

In addition, the heating time is not particularly limited but is preferably 15 seconds to 10 minutes from the viewpoints of the uniformity of the film and productivity.

In addition, the atmosphere in the drying step is not particularly limited. However, from the viewpoint of manufacturing costs, it is preferable that the drying is performed in air under the atmospheric pressure.

(Conversion Step)

Next, the metal oxide precursor thin film is converted into a metal oxide thin film. In the conversion step, a metal oxide thin film is formed by decomposing nitrate ions and nitrite ions in the dried precursor film.

The conversion treatment in the conversion step is not particularly limited as long as nitrate ions or nitrite ions can be decomposed to form a metal-oxygen bond. Examples of the conversion treatment include ultraviolet irradiation, microwave irradiation, and plasma irradiation. From the viewpoint of obtaining a dense metal oxide thin film within a relatively short period of time, ultraviolet irradiation is preferable as the conversion treatment.

In the ultraviolet irradiation, it is preferable that the metal oxide precursor thin film is irradiated with ultraviolet rays having a wavelength of 300 nm or shorter at an intensity of 10 mW/cm$^2$ or higher. When the wavelength and the intensity are as described above, a dense metal oxide thin film is likely to be obtained within a short period of time.

Examples of a light source used for the ultraviolet irradiation on the metal oxide precursor thin film include a UV lamp and a laser. However, a UV lamp is preferable from the viewpoints of uniformly irradiating a large area with ultrasonic rays and easily obtaining an extremely high illuminance for the large area. Examples of the UV lamp include an excimer lamp, a deuterium lamp, a low pressure mercury lamp, a high pressure mercury lamp, an extra high pressure mercury lamp, a metal halide lamp, a helium lamp, a carbon arc lamp, a cadmium lamp, and an electrodeless discharge lamp. In particular, a low pressure mercury lamp is preferable because UV rays having a suitable wavelength for the decomposition of nitrate ions and nitrite ions can be obtained at a high illuminance.

As a method of oxidizing a precursor thin film of a metal oxide semiconductor using ultraviolet rays, a UV ozone method is known (refer to WO2009/011224A). In the UV ozone method, ozone is produced by oxygen being absorbed with ultraviolet irradiation in the presence of oxygen, and a precursor thin film is oxidized by the action of active oxygen having strong oxidizing power which is obtained by the decomposition of ozone.

On the other hand, in the method according to the embodiment, ultraviolet rays are directly absorbed by the precursor film to decompose nitrate ions in the film, thereby forming an oxide semiconductor film. In this method, the production of ozone causes a decrease in the intensity of ultraviolet rays with which the precursor film is irradiated. Therefore, when this method is compared to the UV ozone method, the treatment can be performed using an inexpensive low-illuminance lamp, and nitrate ions in the film can be more easily decomposed. From this point of view, it is preferable that the oxygen concentration is low in the atmosphere, and it is more preferable that the treatment is performed in a non-oxidizing atmosphere such as a nitrogen atmosphere or an argon atmosphere.

During the ultraviolet irradiation, for example, when heat generated from a lamp is used, the substrate temperature can be controlled by adjusting the lamp output and the distance between the lamp and the substrate. In addition, the substrate temperature may be controlled by using a hot plate as a stage on which the substrate is arranged and controlling the top plate temperature of the hot plate.

Although depending on the illuminance of ultraviolet rays, the ultraviolet irradiation time is 5 seconds to 120 minutes from the viewpoint of productivity.

In the conversion step, the maximum temperature of the substrate is preferably 120° C. to 200° C. When the maximum temperature of the substrate is 120° C. or higher, a dense metal oxide thin film is likely to be obtained. When the maximum temperature of the substrate is 200° C. or lower, the application to an inexpensive plastic substrate having low heat resistance is easy.

<Metal Oxide Thin Film>

The metal oxide thin film produced as described above (the metal oxide thin film according to the present invention) contains not only a metal oxide but also a $NO_2$ component (nitrite ions and/or nitrous acid gas) produced by the decomposition of nitrate ions. The film containing a $NO_2$ component can be verified by X-ray photoelectron spectroscopy (XPS). In addition, the film containing a $NO_3$ component such as nitrate ions can also be verified by XPS.

Specifically, when the film contains a $NO_2$ component, a component having a peak position in a binding energy range of 402 eV to 405 eV is verified in an XPS spectrum obtained by XPS. In addition, when the film contains a $NO_3$ component, a component having a peak position in a binding energy range of 406 eV to 408 eV is verified in the XPS spectrum (refer to J. Phys. Chem. B, 104 (2000) 319).

That is, the metal oxide thin film according to the present invention has a peak which is attributed to 1 s electrons of nitrogen in a binding energy range of 402 eV to 405 eV in an XPS spectrum obtained by X-ray photoelectron spectroscopy, in which peak areas, which are obtained by separation of peaks having a peak energy attributed to 1 s electrons of oxygen, satisfy the following expression (1).

$$0.9 < D/E \tag{1}$$

(D represents a peak area of a component having a peak position in a binding energy range of 529 eV or higher and lower than 531 eV, and E represents a peak area of a component having a peak position in a binding energy range of 531 eV to 532 eV.)

It is preferable that the metal oxide thin film according to the present invention does not substantially contain a component having a peak position in a binding energy range of 406 eV to 408 eV in the XPS spectrum.

When the metal oxide thin film according to the present invention is a semiconductor film or a conductive film, it is preferable that the following expression (2) is satisfied, and it is more preferable that the following expression (3) is satisfied.

$$0.9 < D/E \le 5.5 \tag{2}$$

$$1 \le D/E \le 5.1 \tag{3}$$

When the metal oxide thin film according to the present invention is a semiconductor film or a conductive film, it is preferable that at least indium is contained as one of the metal components. When indium is added, a film having superior electron transfer characteristics is likely to be obtained. When the metal oxide thin film contains not only indium but also at least one metal element selected from the group consisting of zinc, tin, gallium, and aluminum, electron transfer characteristics of the obtained oxide semiconductor film or oxide conductive film are further improved, and electrical stability of the film is improved. Among these metal components, plural kinds may be contained. It is preferable that the content of indium is 50 atom % or higher with respect to all the metal elements contained in the metal oxide thin film. The semiconductor film can be obtained by preparing the coating solution according to the present invention to have a composition which is preferable as a semiconductor film.

<Thin Film Transistor>

The metal oxide thin film according to the embodiment which is a semiconductor is preferable as an active layer (oxide semiconductor layer) of a thin film transistor. As described in the above-described embodiment, by using the method of producing a metal oxide thin film according to the present invention, a dense metal oxide thin film having desired conductivity and a controlled amount of a metal-oxygen-metal bond network can be easily produced on an inexpensive plastic substrate at a low temperature under the atmospheric pressure.

According to the present invention, a dense metal oxide thin film can be produced at a low temperature and at a low cost under the atmospheric pressure, and thus this metal oxide thin film can be preferably used as an active layer of a thin film transistor (TFT). Hereinafter, a preferable embodiment of a thin film transistor will be described.

A device structure of a TFT is not particularly limited and, based on the position of a gate electrode, may be any one of a so-called inverted staggered structure (also referred to as "bottom gate type") and a staggered structure (also referred to as "top gate type"). In addition, based on a contact portion between an active layer and source and drain electrodes (also appropriately referred to as "source-drain electrodes"), the device structure of a TFT may be any one of a so-called top contact type and a bottom contact type.

When a substrate on which a TFT is formed is the bottom layer, the top gate type refers to a configuration in which a gate electrode is arranged on a gate insulating film and in which an active layer is formed below the gate insulating film, and the bottom gate type refers to a configuration in which a gate electrode is arranged below a gate insulating film and in which an active layer is formed above the gate insulating film. The bottom contact type refers to a configuration in which source-drain electrodes are formed before an active layer and in which a lower surface of the active layer contacts the source-drain electrodes. The top contact type refers to a configuration in which an active layer are formed before source-drain electrodes and in which an upper surface of the active layer contacts the source-drain electrodes.

FIG. 1 is a schematic diagram showing an example of a top contact type TFT having a top gate structure. In the TFT 10 shown in FIG. 1, a metal oxide thin film (hereinafter, referred to as "oxide semiconductor film"), which is the above-described semiconductor, is laminated on one main surface of a substrate 12 as an active layer 14. A source electrode 16 and a drain electrode 18 are provided on the active layer 14 to be separated from each other. Further, a gate insulating film 20 and a gate electrode 22 are laminated in this order on the source electrode 16 and the drain electrode 18.

Figure 2:
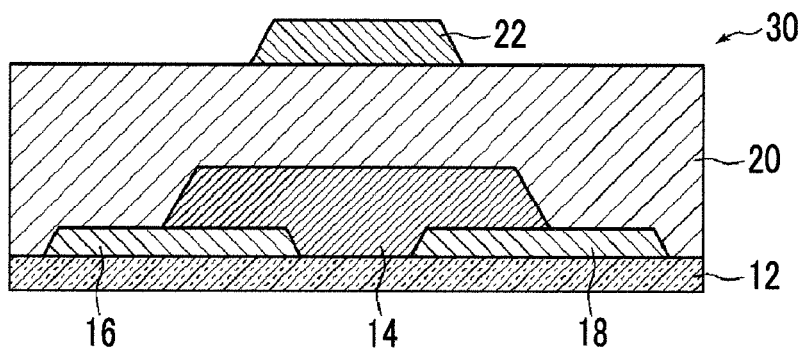
FIG. 2 is a schematic diagram showing a configuration example of a thin film transistor (top gate-bottom contact type) which is manufactured according to the present invention.

FIG. 2 is a schematic diagram showing an example of a bottom contact type TFT having a top gate structure. In a TFT 30 shown in FIG. 2, the source electrode 16 and the drain electrode 18 are provided on one main surface of the substrate 12 to be separated from each other. Next, the above-described oxide semiconductor film as the active layer 14, the gate insulating film 20, and the gate electrode 22 are laminated in this order.

Figure 3:
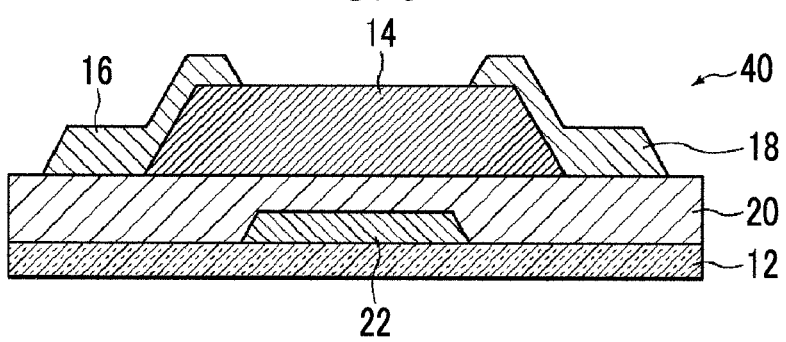
FIG. 3 is a schematic diagram showing a configuration example of a thin film transistor (bottom gate-top contact type) which is manufactured according to the present invention.

FIG. 3 is a schematic diagram showing an example of a top contact type TFT having a bottom gate structure. In a TFT 40 shown in FIG. 3, the gate electrode 22, the gate insulating film 20, and the above-described oxide semiconductor film as the active layer 14 are laminated in this order on one main surface of the substrate 12. The source electrode 16 and the drain electrode 18 are provided on the active layer 14 to be separated from each other.

Figure 4:
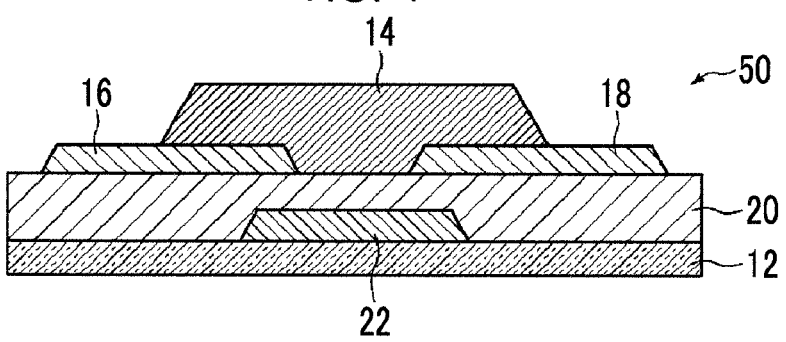
FIG. 4 is a schematic diagram showing a configuration example of a thin film transistor (bottom gate-bottom contact type) which is manufactured according to the present invention.

FIG. 4 is a schematic diagram showing an example of a bottom contact type TFT according to the present invention having a bottom gate structure. In a TFT 50 shown in FIG. 4, the gate electrode 22 and the gate insulating film 20 are laminated in this order on one main surface of the substrate 12. The source electrode 16 and the drain electrode 18 are provided on the gate insulating film 20 to be separated from each other. Further, the above-described oxide semiconductor film as the active layer 14 is laminated on the source electrode 16 and the drain electrode 18.

In the following embodiment, the top gate type thin film transistor 10 shown in FIG. 1 will be mainly described. However, the thin film transistor according to the present invention is not limited to the top gate type and may be a bottom gate type thin film transistor.

(Active Layer)

When the thin film transistor 10 according to the embodiment is manufactured, first, the oxide semiconductor film is formed on the substrate 12 through the precursor thin film forming step and the step of conversion to a metal oxide thin film which are described above. In addition, the oxide semiconductor film may be patterned before the oxide semiconductor film forming step using the above-described method such as an ink jet method, a dispenser method, a relief printing method, or an intaglio printing method, or may be patterned after the oxide semiconductor film forming step using photolithography and etching. It is preferable that the oxide semiconductor film is directly patterned before the oxide semiconductor film forming step using an ink jet method because it is not necessary to perform photolithography and etching processes, and thus the process costs can be reduced.

In order to form a pattern of the active layer 14 using photolithography and etching, first, a resist pattern is formed on a remaining portion for forming the active layer 14 using photolithography and then is etched using an acid solution such as hydrochloric acid, nitric acid, dilute sulfuric acid, or a mixed liquid of phosphoric acid, nitric acid, and acetic acid.

The thickness of the active layer 14 is preferably 5 nm to 40 nm and more preferably 5 nm to 20 nm from the viewpoints of obtaining the flatness of the film, removing an unnecessary portion from the film, and decomposing nitrate ions and nitrite ions with ultraviolet irradiation.

In addition, from the viewpoint of obtaining high mobility, the content of indium in the active layer 14 is preferably 50 atom % or higher and more preferably 80 atom % or higher with respect to all the metal elements contained in the active layer 14.

(Protective Layer)

It is preferable that a protective layer (not shown) is formed on the active layer 14 to protect the active layer 14 during the etching of the source-drain electrodes 16 and 18. A method of forming the protective layer is not particularly limited. The protective layer may be formed before the oxide semiconductor film forming step or may be formed after the oxide semiconductor film forming step. In addition, the protective layer may be formed before or after the patterning of the active layer 14.

The protective layer may be formed of a metal oxide or an organic material such as a resin. The protective layer may be removed after the formation of the source electrode 16 and the drain electrode 18 (appropriately referred to as "source-drain electrodes").

(Source-Drain Electrodes)

The source-drain electrodes 16 and 18 are formed on the active layer 14. The source-drain electrodes 16 and 18 can be formed of a highly conductive material so as to function as electrodes, respectively, and examples of the material include metal such as Al, Mo, Cr, Ta, Ti, Au, or Ag, Al—Nd, a Ag alloy, and a metal oxide conductive film such as tin oxide, zinc oxide, indium oxide, indium tin oxide (ITO), indium zinc oxide (IZO) or In—Ga—Zn—O.

The source-drain electrodes 16 and 18 may be formed using a method which is appropriately selected from a wet method such as a printing method or a coating method, a physical method such as a vacuum deposition method, a sputtering method, or an ion plating method, and a chemical method such as a CVD method or a plasma CVD method in consideration of aptitude with a material to be used.

In consideration of film formability, patterning characteristics using an etching or lift-off method, conductivity, and the like, the thickness of the source-drain electrodes 16 and 18 is preferably 10 nm to 1000 nm and more preferably 50 nm to 100 nm.

The source-drain electrodes 16 and 18 may be formed, for example, by forming a conductive film and then patterning the conductive film into a predetermined shape using an etching or lift-off method or by directly forming a pattern using an ink jet method or the like. At this time, it is preferable that the source-drain electrodes 16 and 18 and wirings (not shown) for connection to these electrodes are simultaneously patterned.

(Gate Insulating Film)

After the formation of the source-drain electrodes 16 and 18 and the wirings (not shown), the gate insulating film 20 is formed. It is preferable that the gate insulating film 20 has high insulating characteristics and may be, for example, an insulating film such as $SiO_2$, $SiN_x$, SiON, $Al_2O_3$, $Y_2O_3$, $Ta_2O_5$, or $HfO_2$ or an insulating film containing two or more of the above compounds.

The gate insulating film 20 may be formed using a method which is appropriately selected from a wet method such as a printing method or a coating method, a physical method such as a vacuum deposition method, a sputtering method, or an ion plating method, and a chemical method such as a CVD method or a plasma CVD method in consideration of aptitude with a material to be used.

It is necessary that the gate insulating film 20 has a thickness to decrease a leakage current and to improve voltage resistance. On the other hand, when the thickness of the gate insulating film 20 is excessively large, the drive voltage increases. Although depending on the material, the thickness of the gate insulating film 20 is preferably 10 nm to 10 μm, more preferably 50 nm to 1000 nm, and still more preferably 100 nm to 400 nm.

(Gate Electrode)

After the formation of the gate insulating film 20, the gate electrode 22 is formed. The gate electrode 22 can be formed of a highly conductive material, and examples of the material include metal such as Al, Mo, Cr, Ta, Ti, Au, or Ag, Al—Nd, a Ag alloy, and a metal oxide conductive film such as tin oxide, zinc oxide, indium oxide, indium tin oxide (ITO), indium zinc oxide (IZO) or IGZO. The gate electrode 22 may be a single-layer structure or a laminate structure containing two or more layers of the above conductive films.

The gate electrode 22 is formed using a method which is appropriately selected from a wet method such as a printing method or coating method, a physical method such as a vacuum deposition method, a sputtering method, or an ion plating method, and a chemical method such as a CVD method or a plasma CVD method in consideration of aptitude with a material to be used. In consideration of film formability, patterning characteristics using an etching or lift-off method, conductivity, and the like, the thickness of the metal film for forming the gate electrode 22 is preferably 10 nm to 1000 nm and more preferably 50 nm to 200 nm.

The gate electrode 22 may be formed, for example, by forming a film and then patterning the film into a predetermined shape using an etching or lift-off method or by directly forming a pattern using an ink jet method or the like. At this time, it is preferable that the gate electrode 22 and gate wirings (not shown) are simultaneously patterned.

The use of the above-described thin film transistor 10 according to the embodiment is not particularly limited. However, the thin film transistor 10 exhibits high transport characteristics and thus is preferably used for manufacturing a driver element or a flexible display using a resin substrate having low heat resistance in a display apparatus such as a liquid crystal display apparatus, an organic electroluminescence (EL) display apparatus, or an inorganic EL display apparatus.

Further, the thin film transistor which is manufactured according to the present invention is preferably used as a driver element (driver circuit) in various electronic devices including various sensors such as an X-ray sensor or an image sensor and a micro electromechanical system).

<Liquid Crystal Display Apparatus>

Figure 5:
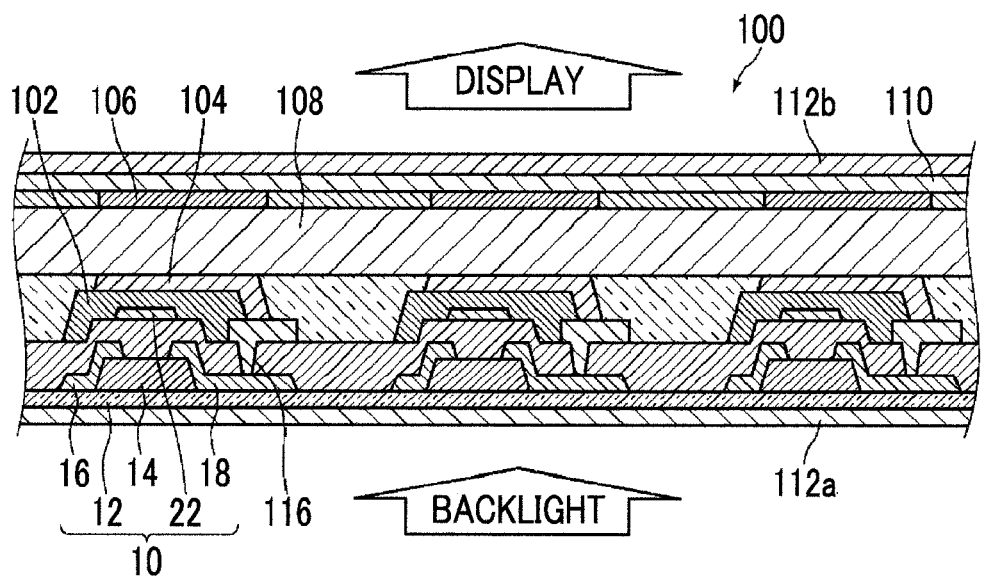
FIG. 5 is a schematic cross-sectional view showing a part of a liquid crystal display apparatus according to an embodiment of the present invention.
Figure 6:
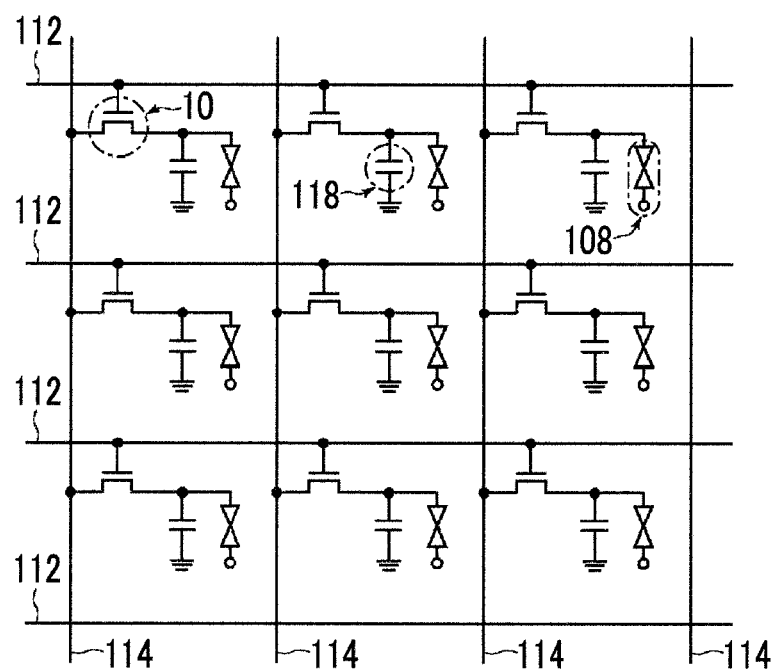
FIG. 6 is a schematic diagram showing a configuration of electric wirings of a liquid crystal display apparatus shown in FIG. 5.

Regarding a liquid crystal display apparatus according to an embodiment of the present invention, FIG. 5 is a schematic cross-sectional view showing a part thereof, and FIG. 6 is a schematic diagram showing a configuration of electric wirings thereof.

As shown in FIG. 5, a liquid crystal display apparatus 100 according to the embodiment includes: the top contact type TFT 10 having a top gate structure shown in FIG. 1; a liquid crystal layer 108 that is formed on the gate electrode 22, protected by a passivation layer 102 of the TFT 10, to be interposed between a pixel lower electrode 104 and an opposite upper electrode 106; and a RGB (red, green, blue) color filter 110 that exhibits different colors according to each pixel. In addition, polarizing plates 112a and 112b are provided on the substrate 12 side and the RGB color filter 110 of the TFT 10.

In addition, as shown in FIG. 6, the liquid crystal display apparatus 100 according to the embodiment includes: plural gate wirings 112 that are parallel to each other; and plural data wirings 114 that intersect with the gate wirings 112 and are parallel to each other. Here, the gate wirings 112 and the data wirings 114 are electrically insulated from each other. The TFT 10 is provided near intersections between the gate wirings 112 and the data wirings 114.

The gate electrode 22 of the TFT 10 is connected to the gate wirings 112, and the source electrode 16 of the TFT 10 is connected to the data wirings 114. In addition, the drain electrode 18 of the TFT 10 is connected to the pixel lower electrode 104 through a contact hole 116 (embedded with a conductor) provided in the gate insulating film 20. The pixel lower electrode 104 forms a capacitor 118 with the opposite upper electrode 106 which is grounded.

<Organic EL Display Apparatus>

Figure 7:
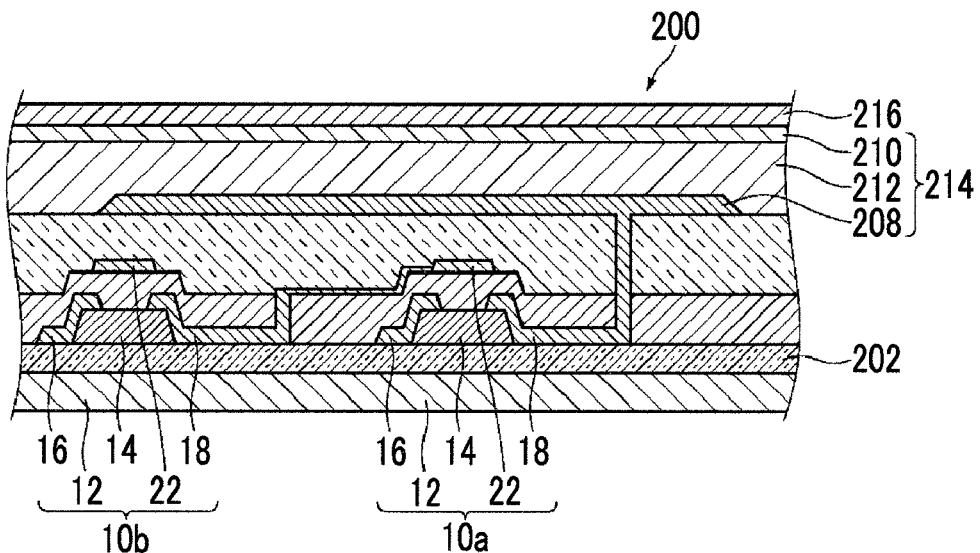
FIG. 7 is a schematic cross-sectional view showing a part of an organic EL display apparatus according to an embodiment of the present invention.
Figure 8:
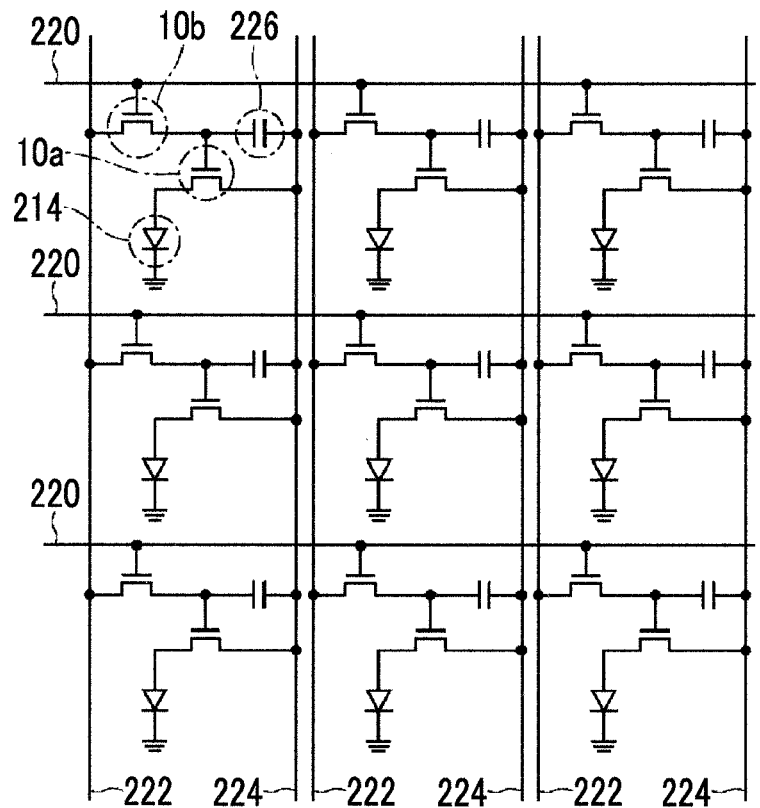
FIG. 8 is a schematic diagram showing a configuration of electric wirings of the organic EL display apparatus shown in FIG. 7.

Regarding an active matrix organic EL display apparatus according to an embodiment of the present invention, FIG. 7 is a schematic cross-sectional view showing a part thereof, and FIG. 8 is a schematic diagram showing a configuration of electric wirings thereof.

In an active matrix organic EL display apparatus 200 according to the embodiment, the TFTs 10 having a top gate structure shown in FIG. 1 are provided on the substrate 12 including a passivation layer 202 as a driving TFT 10a and a switching TFT 10b, an organic EL light emitting element 214 that includes an organic light emitting layer 212 interposed between a lower electrode 208 and an upper electrode 210 is provided on the TFTs 10a and 10b, and a top surface of the organic EL light emitting element 214 is protected by a passivation layer 216.

In addition, as shown in FIG. 8, the organic EL display apparatus 200 according to the embodiment includes: plural gate wirings 220 that are parallel to each other; and plural data wirings 222 and driver wirings 224 that intersect with the gate wirings 220 and are parallel to each other. Here, the gate wirings 220, the data wirings 222, and the driver wirings 224 are electrically insulated from each other. The gate electrode 22 of the switching TFT 10b is connected to the gate wirings 220, and the source electrode 16 of the switching TFT 10b is connected to the data wirings 222. In addition, the drain electrode 18 of the switching TFT 10b is connected to the gate electrode 22 of the driving TFT 10a, and the on-state of the driving TFT 10a is maintained by using a capacitor 226. The source electrode 16 of the driving TFT 10a is connected to the driver wirings 224, and the drain electrode 18 is connected to the organic EL light emitting element 214.

The organic EL display apparatus shown in FIG. 7 may be a top emission type by using a transparent electrode as the upper electrode 210 or may be a bottom emission type by using a transparent electrode as the lower electrode 208 and each electrode of the TFT.

<X-Ray Sensor>

Figure 9:
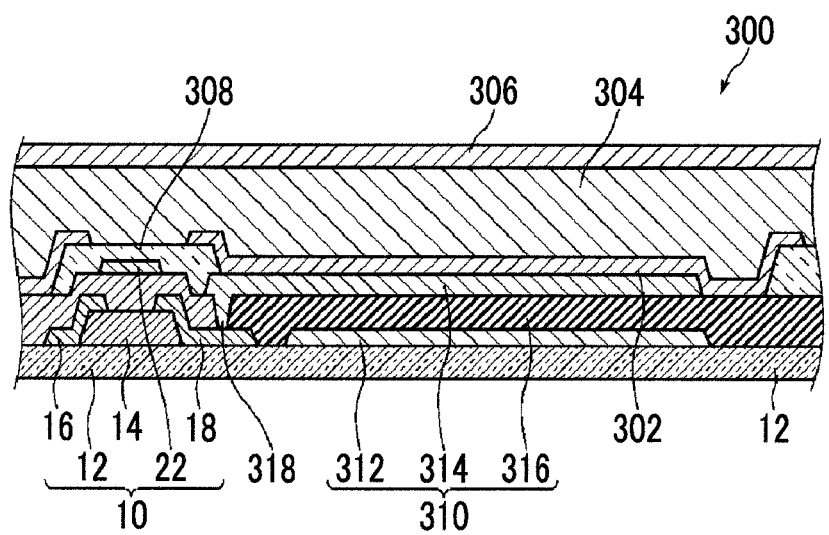
FIG. 9 is a schematic cross-sectional view showing a part of an X-ray sensor array according to an embodiment of the present invention.
Figure 10:
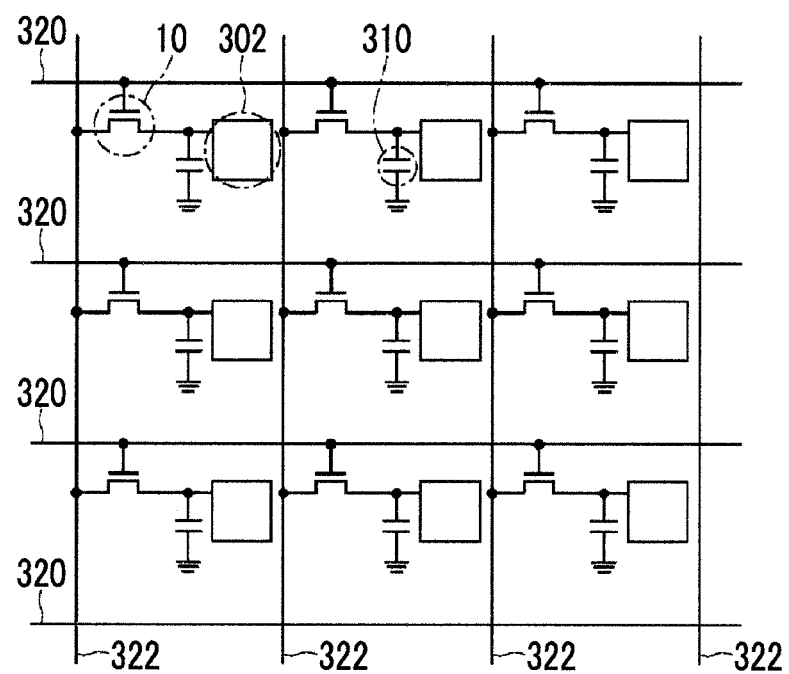
FIG. 10 is a schematic diagram showing a configuration of electric wirings of the X-ray sensor array shown in FIG. 9.

Regarding an X-ray sensor according to an embodiment of the present invention, FIG. 9 is a schematic cross-sectional view showing a part thereof, and FIG. 10 is a schematic diagram showing a configuration of electric wirings thereof.

An X-ray sensor 300 according to the embodiment includes: the TFT 10 and a capacitor 310 that are formed on the substrate 12; a charge collection electrode 302 that is formed on the capacitor 310; an X-ray conversion layer 304; and an upper electrode 306. A passivation film 308 is provided on the TFT 10.

The capacitor 310 has a structure in which an insulating film 316 is interposed between a lower electrode 312 for a capacitor and an upper electrode 314 for a capacitor. The upper electrode 314 for a capacitor is connected to any one (in FIG. 9, the drain electrode 18) of the source electrode 16 and the drain electrode 18 of the TFT 10 through a contact hole 318 provided in the insulating film 316.

The charge collection electrode 302 is provided on the upper electrode 314 for a capacitor in the capacitor 310 and is connected to the upper electrode 314 for a capacitor.

The X-ray conversion layer 304 is formed of amorphous selenium and is provided to cover the TFT 10 and the capacitor 310.

The upper electrode 306 is provided on the X-ray conversion layer 304 and contacts the X-ray conversion layer 304.

As shown in FIG. 9, the X-ray sensor 300 according to the embodiment includes: plural gate wirings 320 that are parallel to each other; and plural data wirings 322 that intersect with the gate wirings 320 and are parallel to each other. Here, the gate wirings 320 and the data wirings 322 are electrically insulated from each other. The TFT 10 is provided near intersections between the gate wirings 320 and the data wirings 322.

The gate electrode 22 of the TFT 10 is connected to the gate wirings 320, and the source electrode 16 of the TFT 10 is connected to the data wirings 322. In addition, the drain electrode 18 of the TFT 10 is connected to the charge collection electrode 302, and the charge collection electrode 302 is connected to the capacitor 310.

In the X-ray sensor 300 according to the embodiment, in FIG. 9, X-rays are incident from the upper electrode 306 side to generate electron-hole pairs on the X-ray conversion layer 304. When a high electric field is applied to the X-ray conversion layer 304 by the upper electrode 306, the generated charges accumulate on the capacitor 310 and are read by sequentially scanning the TFT 10.

In the liquid crystal display apparatus 100, the organic EL display apparatus 200, and the X-ray sensor 300 according to the embodiments, the TFT having a top gate structure is provided. However, the TFT is not limited to this configuration and may have a structure shown in each of FIGS. 2 to 4.

Example 1

Hereinafter, Examples of the present invention will be described, but the present invention is not limited to these Examples.

Examples 1 to 4 and Comparative Example 1

Figure 11A:
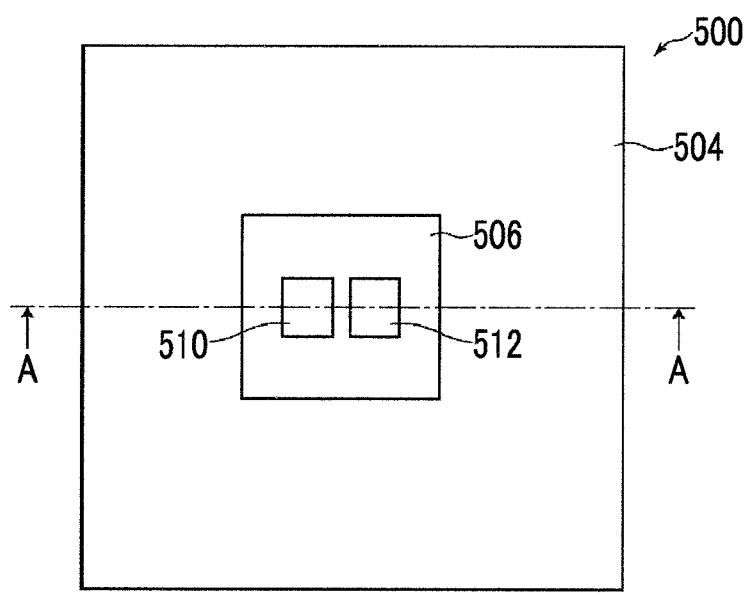
FIG. 11A is a plan view showing a schematic configuration of a simple TFT which is manufactured in each of Examples and Comparative Examples.
Figure 11B:
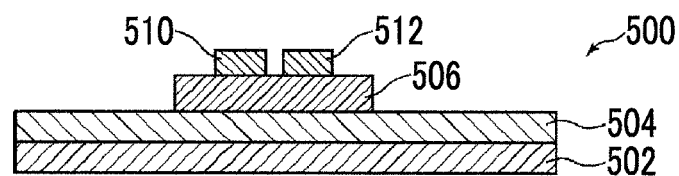
FIG. 11B is a cross-sectional view taken along line A-A of FIG. 11A.

The following device for evaluation was prepared and was evaluated. FIG. 11A is a plan view schematically showing a simple TFT for evaluation, and FIG. 11B is a cross-sectional view taken along line A-A of FIG. 11A.

First, indium nitrate $(In(NO_3)_3 \cdot xH_2O$, 4 N, manufactured by Kojundo Chemical Laboratory Co., Ltd.) was dissolved in 2-methoxyethanol (special grade chemical, manufactured by Wako Pure Chemical Industries, Ltd.) by being stirred at room temperature for 30 minutes. As a result, an indium nitrate solution having a concentration of 0.1 mol/L was prepared. In this indium nitrate solution, the mol concentration A of the metal was 0.1 mol/L, the mol concentration B of nitrate ions was 0.3 mol/L, the average valence when the metal component is a metal oxide thin film was 3, and B/(A×C) was 1.0 (Comparative Example 1).

Concentrated nitric acid (specific gravity: 1.38, special grade chemical, manufactured by Wako Pure Chemical Industries, Ltd.) was added to the indium nitrate solution. As a result, coating solutions having a B/(A×C) value of 1.17 (Example 1), a B/(A×C) value of 1.33 (Example 2), a B/(A×C) value of 1.5 (Example 3), and a B/(A×C) value of 2.0 (Example 4) were prepared.

A simple TFT 500 was prepared in which a p-type Si substrate 502 with a thermal oxide film (100 nm) 504 was used as a substrate, the Si substrate 502 was used as a gate electrode, and the thermal oxide film 504 was used as a gate insulating film.

Five p-type 1-inch☐ Si substrates with the thermal oxide film were prepared. Each of the substrates was spin-coated with the coating solution prepared in each of the examples at a rotating speed of 1500 rpm for 30 seconds. Next, the coating solution was dried on a hot plate heated to 60° C. for 1 minute. As a result, an oxide semiconductor precursor film was obtained.

The oxide semiconductor precursor film obtained in each of the examples was irradiated with ultraviolet rays under the following conditions. As a result, an oxide semiconductor film of each of the examples was obtained. As an ultraviolet irradiation device, a UV ozone cleaner (UV253H, manufactured by Filgen, Inc.) using a low pressure mercury lamp was used.

A sample was set on a 40 mm glass plate, and the distance between the lamp and the sample was 5 mm. The illuminance of ultraviolet rays having a wavelength of 254 nm at a sample position was measured using a ultraviolet light meter (UV-M10, manufactured by Orc Manufacturing Co., Ltd.; light receiving unit UV-25). A lighting lamp reached a maximum value of 15 mW/cm² for 3 minutes.

In a ultraviolet irradiation chamber, nitrogen was blown at 6 L/min for 10 minutes and ultraviolet irradiation was performed for 90 minutes. In the ultraviolet irradiation, nitrogen was blown, typically, at 6 L/min. During the ultraviolet irradiation, the maximum temperature of the substrate was 160° C. when monitored by THERMO LABEL.

Source-drain electrodes 510 and 512 were formed by vapor deposition on an oxide semiconductor film 506 obtained in each of the examples. Patterns of the source-drain electrodes 510 and 512 were formed using a metal mask, and a Ti film having a thickness of 50 nm was formed. The size of each of the source-drain electrodes 510 and 512 was 1 mm□, and the distance between the electrodes was 0.2 mm. As a result, the simple TFT 500 was prepared.

[Evaluation]

<Transistor Characteristics>

Regarding the simple TFT obtained in each of the examples, transistor characteristics (Vg-Id characteristics) were measured using a semiconductor parameter analyzer 4156C (manufactured by Agilent Technologies Inc.).

During the measurement of Vg-Id characteristics, the drain voltage (Vd) was fixed to +1 V, the gate voltage (Vg) was changed in a range of −15 V to +15 V, and the drain current (Id) at each gate voltage (Vg) was measured.

Figure 12:
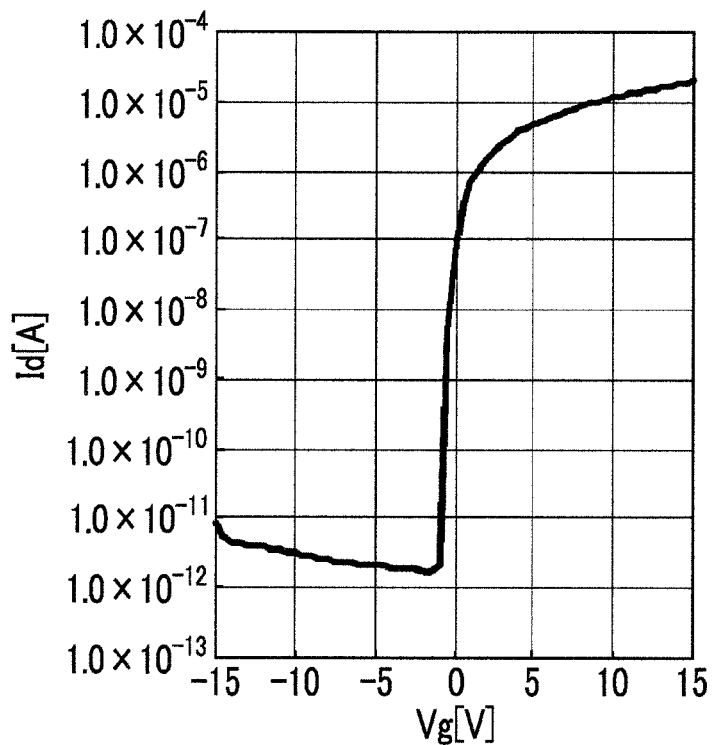
FIG. 12 is a diagram showing Vg-Id characteristics of a TFT manufactured in Example 1.
Figure 13:
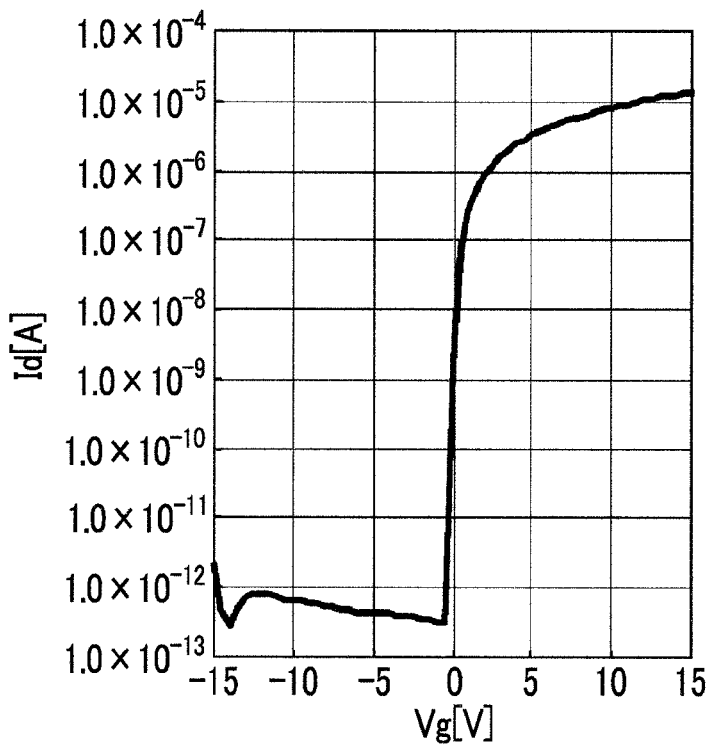
FIG. 13 is a diagram showing Vg-Id characteristics of a TFT manufactured in Comparative Example 1.

FIGS. 12 and 13 show Vg-Id characteristics of Example 1 and Comparative Example 1, respectively. In addition, Table 1 shows linear mobility, estimated from Vg-Id characteristics in each of the examples, and a threshold voltage. It was verified that a TFT having high transistor operation characteristics can be manufactured by controlling the value of B/(A×C) in the solution as shown in Table 1.

Figure 14:
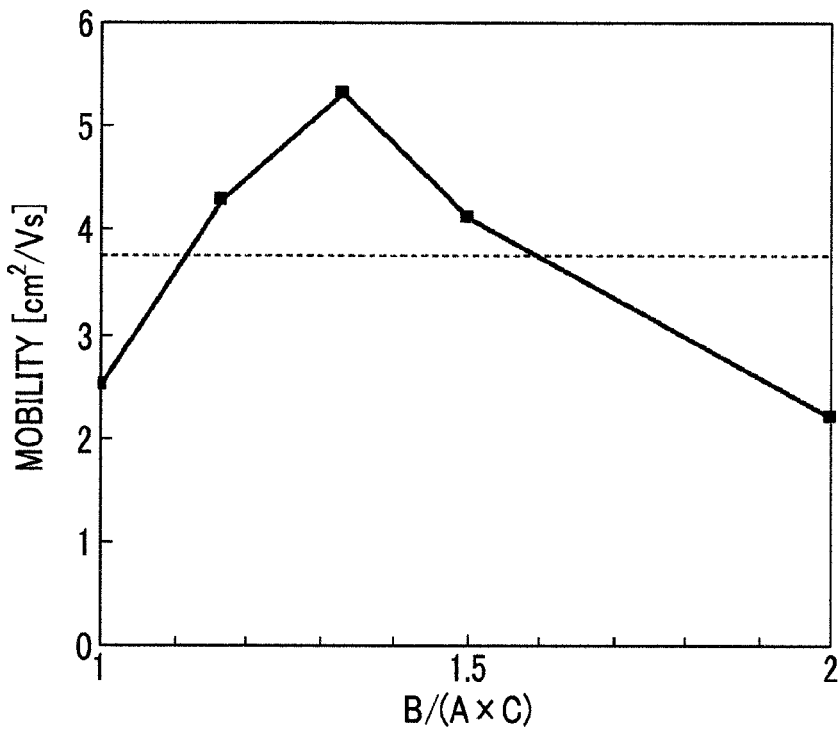
FIG. 14 is a diagram showing a relationship between mobility and a ratio B/(A×C) of the mol concentration of metal components to the mol concentration of nitrate ions or nitrite ions in a coating solution used in each of Examples 1 to 4 and Comparative Example 1.

FIG. 14 collectively shows a relationship between linear mobility and a B/(A×C) value in the coating solution in each of the examples. FIG. 14 shows that an effect of improving the mobility can be verified in a region of 1<B/(A×C)≤1.9 and that an effect of improving the mobility by 50% or higher is obtained in a region of 1.1≤B/(A×C)≤1.6.

<X-Ray Photoelectron Spectroscopy>

The metal oxide semiconductor thin film of each of Examples 1 to 4 and Comparative Example 1 was analyzed by X-ray photoelectron spectroscopy (XPS). As a measuring device, QUANTERA SXM (manufactured by ULVAC-PHI, Inc.) was used. Measurement conditions were X-ray source: monochromatic AlKα (100 μmϕ, 25 W, 15 kV), analysis diameter: 100 μmϕ, and photoelectron extraction angle: 45°.

Figure 15:
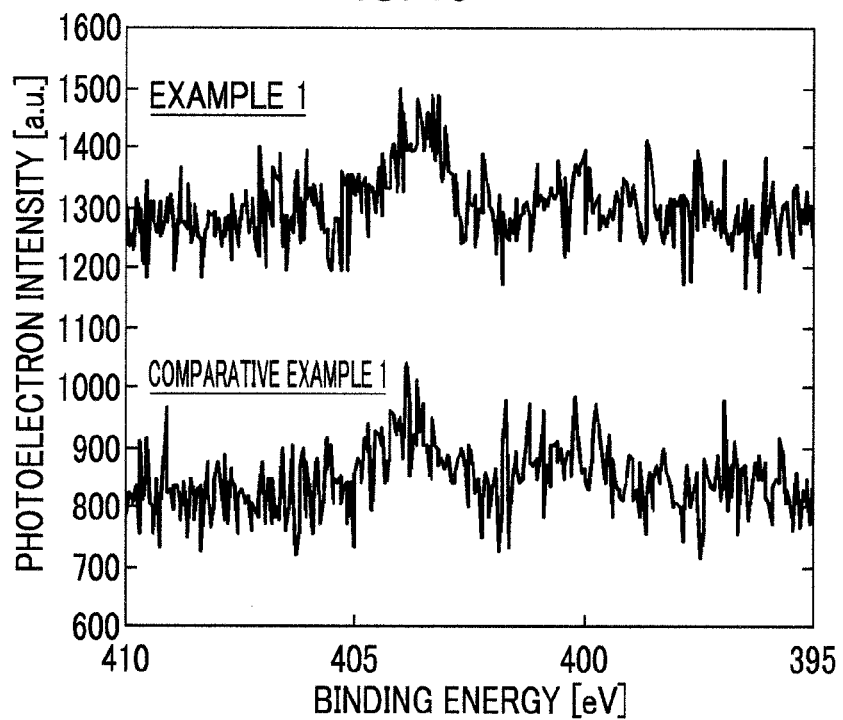
FIG. 15 is a diagram showing a nitrogen 1 s XPS spectrum of a metal oxide thin film formed in each of Example 1 and Comparative Example 1.

A peak derived from a nitrous acid component attributed to 1 s electrons of nitrogen was detected at about 402 eV to 405 eV. FIG. 15 shows an XPS spectrum (a binding energy range of 395 eV to 410 eV attributed to 1 s electrons of nitrogen) of the metal oxide semiconductor thin film of each of Example 1 and Comparative Example 1. In the spectrum of each of Example 1 and Comparative Example 1, a component having a peak position at about 404 eV was verified. In addition, the same peak component was verified in the other examples. When the metal oxide semiconductor precursor thin film or the metal oxide semiconductor thin film, which was not sufficiently irradiated with ultraviolet rays, was analyzed by X-ray photoelectron spectroscopy, a peak derived from a nitrous acid component was not able to be verified and was extremely weak. As a peak attributed to 1 s electrons of nitrogen, a peak derived from a nitric acid component (having a peak position at about 406 eV to 408 eV) was relatively strong. Regarding these films, the transistor operation was not verified in a transistor characteristic evaluation.

Figure 16:
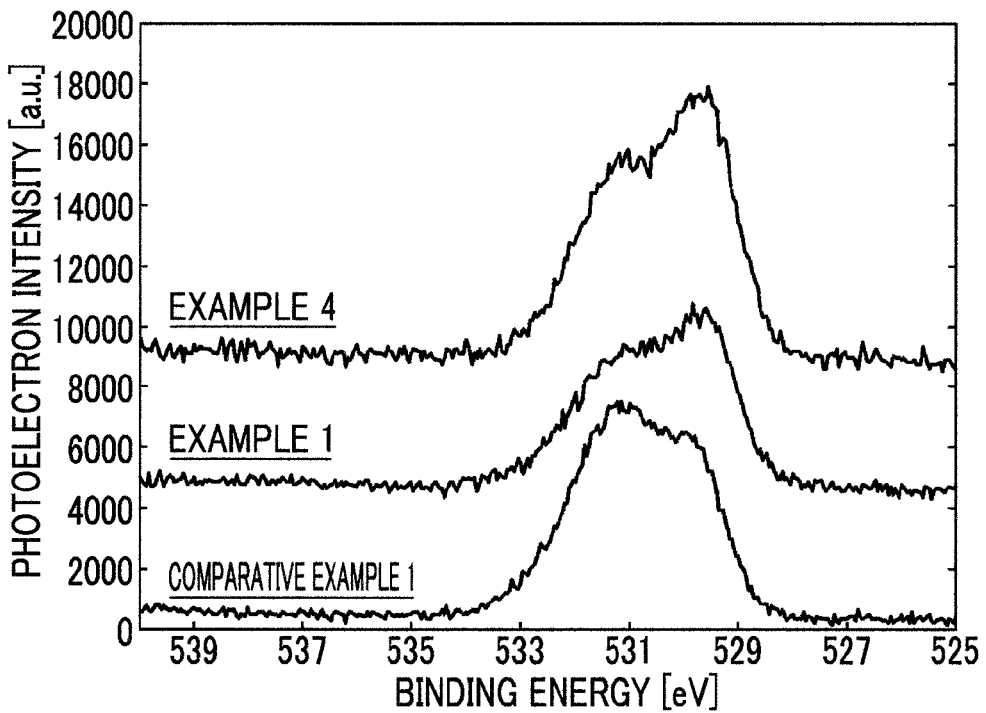
FIG. 16 is a diagram showing a nitrogen is XPS spectrum of a metal oxide thin film formed in each of Examples 1 and 4 and Comparative Example 1.

FIG. 16 shows an XPS spectrum (a binding energy range of 525 eV to 540 eV attributed to 1 s electrons of oxygen) of the metal oxide semiconductor thin film of each of Example 1, 4 and Comparative Example 1. In the spectrum of each of Example 1 and Comparative Example 1, a component having a peak position at 529 eV to 530 eV (metal-oxygen-metal bond) and a component having a peak position at 531 eV to 532 eV (metal-oxygen bond having oxygen defect) were verified. In addition, the peak component was verified at the same position in the other examples. In addition, it can be verified that, in Examples 1 and 4 in which concentrated nitric acid was added, the intensity of a component having a peak position at 529 eV to 530 eV increases in response to an increase in the addition amount of concentrated nitric acid, as compared to Comparative Example 1 in which concentrated nitric acid was not added.

Table 2 shows linear mobility evaluated from $V_g$-$I_d$ characteristics and a ratio (D/E) where, when peaks attributed to 1 s electrons of oxygen are separated, D represents a peak area of a component having a peak position in a binding energy range of 529 eV or higher and lower than 531 eV, and E represents a peak area of a component having a peak position in a binding energy range of 531 eV to 532 eV.

Figure 17:
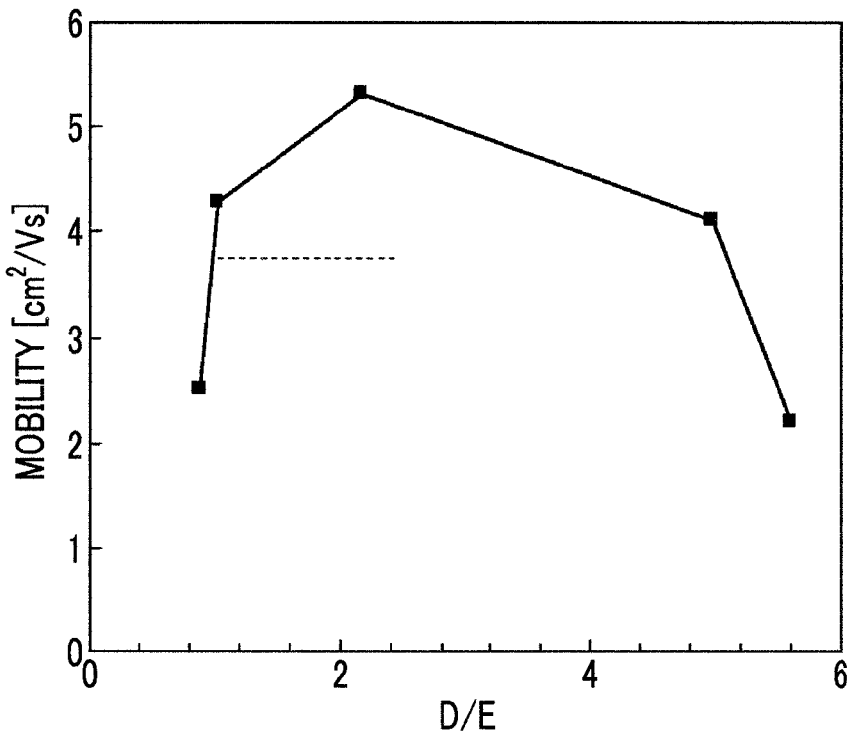
FIG. 17 is a diagram showing a relationship between mobility and a ratio D/E of peak areas of peaks attributed to 1 s electrons of oxygen in XPS spectrum of a metal oxide thin film formed in each of Examples 1 to 4 and Comparative Example 1.

In addition, FIG. 17 collectively shows a relationship between D/E and linear mobility in each of the examples. The following effects were found that: an effect of improving the mobility is verified in a region of 0.9<D/e≤5.5; and an effect of improving the mobility by 50% or higher is obtained in a region of 1≤B/(A×C)≤5.1.

TABLE 1

|  | B/(A × C) | Linear Mobility (cm²/Vs) | Threshold Voltage ($V_{th}$) |
| --- | --- | --- | --- |
| Comparative Example 1 | 1.0 | 2.5 | 2.7 |
| Example 1 | 1.17 | 4.3 | 2.8 |
| Example 2 | 1.33 | 5.3 | 2.8 |
| Example 3 | 1.5 | 4.1 | 2.9 |
| Example 4 | 2.0 | 2.2 | 3.9 |

|  | D/E | Linear Mobility (cm²/Vs) |
| --- | --- | --- |
| Comparative Example 1 | 0.9 | 2.5 |
| Example 1 | 1.0 | 4.3 |
| Example 2 | 2.2 | 5.3 |
| Example 3 | 5.0 | 4.1 |
| Example 4 | 5.6 | 2.2 |

The present invention is applicable to the manufacturing of: a thin film transistor; and an electronic device including the same, for example, a display apparatus such as an organic EL display, electronic paper, or a liquid crystal display, or a semiconductor device such as an X-ray FPD or a sensor.

What is claimed is:

1. A metal oxide thin film comprising
   a component having a peak position which is attributed to 1 s electrons of nitrogen in a binding energy range of 402 eV to 405 eV in an XPS spectrum obtained by X-ray photoelectron spectroscopy, wherein peak areas, which are obtained by separation of peaks attributed to 1 s electrons of oxygen, satisfy 0.9<D/E, D represents a peak area of a component having a peak position in a binding energy range of 529 eV or higher and lower than 531 eV, and E represents a peak area of a component having a peak position in a binding energy range of 531 eV to 532 eV, and wherein a content of indium is 50 atom % or higher with respect to all metal elements contained in the metal oxide thin film.

2. The metal oxide thin film according to claim 1, wherein in the XPS spectrum, a component having a peak position in a binding energy range of 406 eV to 408 eV is not substantially contained.

3. The metal oxide thin film according to claim 1, wherein $0.9<D/E \leq 5.5$ is satisfied.

4. The metal oxide thin film according to claim 3, wherein $1 \leq D/E \leq 5.1$ is satisfied.

5. The metal oxide thin film according to claim 3, wherein the metal oxide thin film is a semiconductor thin film.

6. The metal oxide thin film according to claim 3, wherein indium and at least one metal selected from the group consisting of zinc, tin, gallium, and aluminum are contained.

7. A thin film transistor comprising the metal oxide thin film according to claim 5 as an active layer.

8. A display apparatus comprising the thin film transistor according to claim 7.

* * * * *